United States Patent
Lee et al.

(10) Patent No.: US 9,196,475 B2
(45) Date of Patent: Nov. 24, 2015

(54) METHODS FOR FABRICATING INTEGRATED CIRCUITS INCLUDING FLUORINE INCORPORATION

(71) Applicants: GLOBALFOUNDRIES, Inc., Grand Cayman (KY); Intermolecular, Inc., San Jose, CA (US)

(72) Inventors: Bongki Lee, Austin, TX (US); Paul Besser, Sunnyvale, CA (US); Kevin Kashefi, San Ramon, CA (US); Olov Karlsson, San Jose, CA (US); Ashish Bodke, San Jose, CA (US); Ratsamee Limdulpaiboon, San Jose, CA (US); Divya Pisharoty, Fremont, CA (US); Nobi Fuchigami, Sunnyvale, CA (US)

(73) Assignees: GLOBALFOUNDRIES, INC., Grand Cayman (KY); INTERMOLECULAR, INC., San Jose, CA (US)

( * ) Notice: Subject to any disclaimer, the term of this patent is extended or adjusted under 35 U.S.C. 154(b) by 0 days.

(21) Appl. No.: 14/253,906

(22) Filed: Apr. 16, 2014

(65) Prior Publication Data

US 2015/0303057 A1 Oct. 22, 2015

(51) Int. Cl.
*H01L 23/48* (2006.01)
*H01L 21/02* (2006.01)
*H01L 21/28* (2006.01)
*H01L 29/51* (2006.01)

(52) U.S. Cl.
CPC .... *H01L 21/02181* (2013.01); *H01L 21/02164* (2013.01); *H01L 21/02321* (2013.01); *H01L 21/02362* (2013.01); *H01L 21/28185* (2013.01); *H01L 29/517* (2013.01)

(58) Field of Classification Search
USPC .......................................................... 257/760
See application file for complete search history.

(56) References Cited

U.S. PATENT DOCUMENTS

| | | | |
|---|---|---|---|
| 7,422,936 B2 | 9/2008 | Barns et al. | |
| 2013/0267086 A1* | 10/2013 | Erben et al. | 438/585 |
| 2013/0344692 A1* | 12/2013 | Triyoso et al. | 438/591 |

OTHER PUBLICATIONS

Ando, Ultimate Scaling of High-γ Gate Dielectrics: Higher-γ or Interfaciai Layer Scavenging? Materials, Mar. 14, 2012, 5, pp. 478-500.
Kim, Engineering Chemically Arupt High-γ Oxidesilicon Interfaces Using an Oxygen-Gettering Metal Overlayer, AIP, Journal of Applied Physics, 2004, Sep. 14, 2004, pp. 3467-3472, vol. 96, No. 6.

* cited by examiner

*Primary Examiner* — Thao P Le
(74) *Attorney, Agent, or Firm* — Ingrassia Fisher & Lorenz, P.C.

(57) ABSTRACT

Integrated circuits and methods for fabricating integrated circuits are provided. In one example, a method for fabricating an integrated circuit includes forming an interlayer of dielectric oxide material in a FET region and overlying a semiconductor substrate. A high-K dielectric layer is deposited overlying the interlayer. Fluorine is incorporated into the interlayer and/or the high-K dielectric layer.

18 Claims, 2 Drawing Sheets

METHODS FOR FABRICATING INTEGRATED CIRCUITS INCLUDING FLUORINE INCORPORATION

TECHNICAL FIELD

The technical field relates generally to integrated circuits and methods for fabricating integrated circuits, and more particularly relates to integrated circuits and methods for fabricating integrated circuits using fluorine to passivate an interlayer of dielectric oxide material and/or a high-K dielectric layer of a FET region.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. The ICs are usually formed using both P-channel FETs (PMOS transistors or PFETs) and N-channel FETs (NMOS transistors or NFETs) and the IC is then referred to as a complementary MOS or CMOS circuit. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the device size decreases.

In some integrated circuit designs there has been a desire to eliminate the use of polysilicon gate electrodes to improve device performance with decreased feature sizes. Replacing polysilicon gate structures with metal gate stacks is one solution. A typical metal gate stack includes a metal gate that overlies a high dielectric constant (high-K) dielectric layer and an interlayer of a dielectric oxide material that is disposed between the high-K dielectric layer and a semiconductor substrate. Unfortunately, the various metal gate stack materials sometimes face significant difficulties that can result in threshold voltage V(t) instability and performance degradation of the devices. These problems are related to the high amount of bulk defects and interface states (e.g., interface traps in the bulk of the interlayer or high-K dielectric layer due to the existence of dangling bonds, e.g., partial or imperfect bonds between adjacent atoms resulting in free electrons around the atoms) in the metal gate stack, leading to negative bias temperature instability (NBTI) and positive bias temperature instabilities (PBTI) issues.

Accordingly, it is desirable to provide integrated circuits and methods of forming integrated circuits that reduce the number of interface and bulk defects in a metal gate stack to improve, for example, NBTI and PBTI behavior. Furthermore, other desirable features and characteristics of the present invention will become apparent from the subsequent detailed description and the appended claims, taken in conjunction with the accompanying drawings and this background.

BRIEF SUMMARY

Integrated circuits and methods for fabricating integrated circuits are provided herein. In accordance with an exemplary embodiment, a method for fabricating an integrated circuit includes forming an interlayer of dielectric oxide material in a FET region and overlying a semiconductor substrate. A high-K dielectric layer is deposited overlying the interlayer. F is incorporated into the interlayer and/or the high-K dielectric layer.

In accordance with another exemplary embodiment, a method for fabricating an integrated circuit is provided. The method includes forming a trench in an ILD layer of dielectric material in a FET region and overlying a semiconductor substrate. An interlayer of dielectric oxide material is formed in the trench. A high-K dielectric layer is deposited overlying the interlayer. The high-K dielectric layer is annealed to form an annealed high-K dielectric layer. The annealed high-K dielectric layer is exposed to a $NF_3$ plasma treatment process.

In accordance with another exemplary embodiment, an integrated circuit is provided. The integrated circuit includes a semiconductor substrate at least partially including a FET region. An interlayer of dielectric oxide material disposed in the FET region overlying the semiconductor substrate. A high-K dielectric layer overlies the interlayer. The interlayer and/or the high-K dielectric layer have F incorporated therein.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to integrated circuits and methods for fabricating integrated circuits. During intermediate stages of the fabrication of an integrated circuit (IC), an interlayer of dielectric oxide material is deposited overlying a semiconductor substrate in a field effect transistor (FET) region that is at least partially formed in the semiconductor substrate. In an exemplary embodiment, the dielectric oxide material is silicon dioxide ($SiO_2$). A high-K dielectric layer is deposited overlying the interlayer. The high-K dielectric layer is annealed. In an exemplary embodiment, the high-K dielectric layer is exposed to a $NF_3$ plasma treatment process either before or after annealing to incorporate fluorine (F) into the high-K dielectric layer and the underlying interlayer. In an exemplary embodiment, the high-K dielectric layer is formed of hafnium dioxide ($HfO_2$). A metal gate is formed over the high-K dielectric layer and a low resistance layer is deposited over the metal gate to form a metal gate stack. It has been found that by incorporating fluorine into the interlayer and/or the high-K dielectric layer, the NBTI and PBTI behavior of the metal gate stack is significantly improved. Without being limited by theory, in an exemplary embodiment, it is believed that the incorporation of fluorine selectively into the stack replaces at least some of the partially or imperfectly bonded atoms (e.g., 0 atoms) with F atoms in the $SiO_2$ and/or $HfO_2$ material-containing layers, thereby passivating the dangling bonds (e.g., Si—O or Hf—O) to reduce the number of interface and bulk defects and improve the NBTI and PBTI behavior of the metal gate stack.

FIGS. 1-4 illustrate methods for fabricating an IC 10 in accordance with various embodiments. The described process steps, procedures, and materials are to be considered only as exemplary embodiments designed to illustrate to one of ordinary skill in the art methods for practicing the invention; the invention is not limited to these exemplary embodiments. Various steps in the manufacture of ICs are well known and so, in the interest of brevity, many conventional steps will only be mentioned briefly herein or will be omitted entirely without providing the well-known process details.

Figure 1:
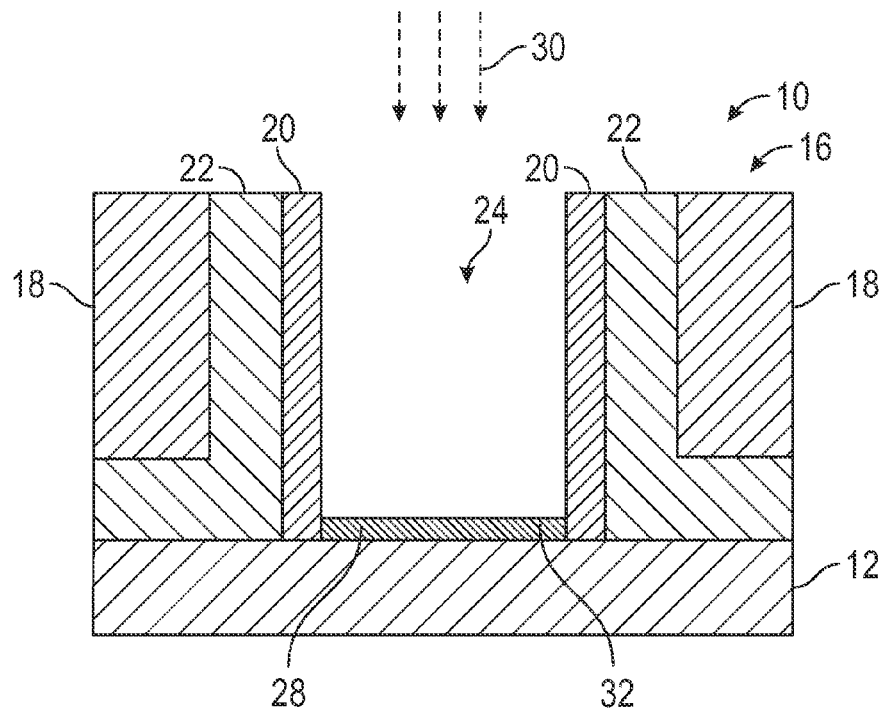
FIGS. 1-4 illustrate, in cross-sectional views, an integrated circuit and a method for fabricating an integrated circuit during various intermediate fabrication stages in accordance with an exemplary embodiment.

FIG. 1 illustrates, in cross-sectional view, a portion of the IC 10 during an intermediate fabrication stage in accordance with an exemplary embodiment. The IC 10 includes a semiconductor substrate 12 on which shallow trench isolation (STI) structures, source/drain regions, source/drain extension regions, gate dielectric, contacts, spacers, dummy gate patterns, hard mask layers, and other features may be formed. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In an addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or maybe a thin layer of silicon on an insulating layer (commonly known as silicon-on-insulator or SOI) that, in turn, is supported by a carrier wafer. The semiconductor substrate 12 includes various doping configurations as are known in the art for defining a field effect transistor (FET) region 16, which may be a N-channel field effect transistor (NFET) region or a P-channel field effect transistor (PFET) region.

As shown, an interlayer dielectric (ILD) layer 18 of dielectric material is formed on the semiconductor substrate 12 by chemical vapor deposition (CVD), high-density plasma CVD, spin-on, sputtering, or any other method known to those skilled in the art. The ILD layer 18 may include silicon oxide, silicon oxynitride, or other low dielectric constant material.

In an exemplary embodiment, spacers 20 and 22 are disposed in the ILD layer 18 overlying the semiconductor substrate 12 and cooperatively define a trench 24, which may be for a NFET device or a PFET device. Typically, the trench 24 may be formed by forming a dummy gate on the semiconductor substrate 12, forming the spacers 20 and 22 on the dummy gate, depositing and planarizing the ILD layer 18, and removing the dummy gate in accordance with a conventional replacement metal gate process.

Formed in the trench is an interlayer 28 that overlies the semiconductor substrate 12. The interlayer 28 is composed of a dielectric oxide material, such as silicon oxide or silicon oxynitride. In an exemplary embodiment, the interlayer 28 is silicon dioxide ($SiO_2$). The interlayer 28 may be deposited using any deposition process, such as a CVD process, an atomic layer deposition (ALD) process, a thermal oxidation process, or a wet chemical oxidation process. In an exemplary embodiment, the interlayer 28 has a thickness of from about 0.1 to about 3 nm.

The dielectric oxide material of the interlayer 28 may include some partially or imperfectly bonded atoms (e.g., dangling bonds), such as unsaturated bonds between, for example, Si and O atoms in the $SiO_2$ matrix. In one optional embodiment, the interlayer 28 may be exposed directly to a nitrogen trifluoride ($NF_3$) plasma treatment process 30 at this fabrication stage as illustrated in FIG. 1. The $NF_3$ plasma treatment process 30, which is discussed in further detail below, produces fluorine ions that penetrate the interlayer 28, displacing and replacing at least some of the partially or imperfectly bonded atoms (e.g., O atoms), thereby incorporating fluorine atoms into the dielectric oxide material to passivate (e.g., reduce the number of dangling bonds) the interlayer 28 and form a passivated interlayer 32. In an exemplary embodiment, the passivated interlayer 32 has a reduced number of interface and bulk defects relative to the untreated interface layer 28.

Figure 2:
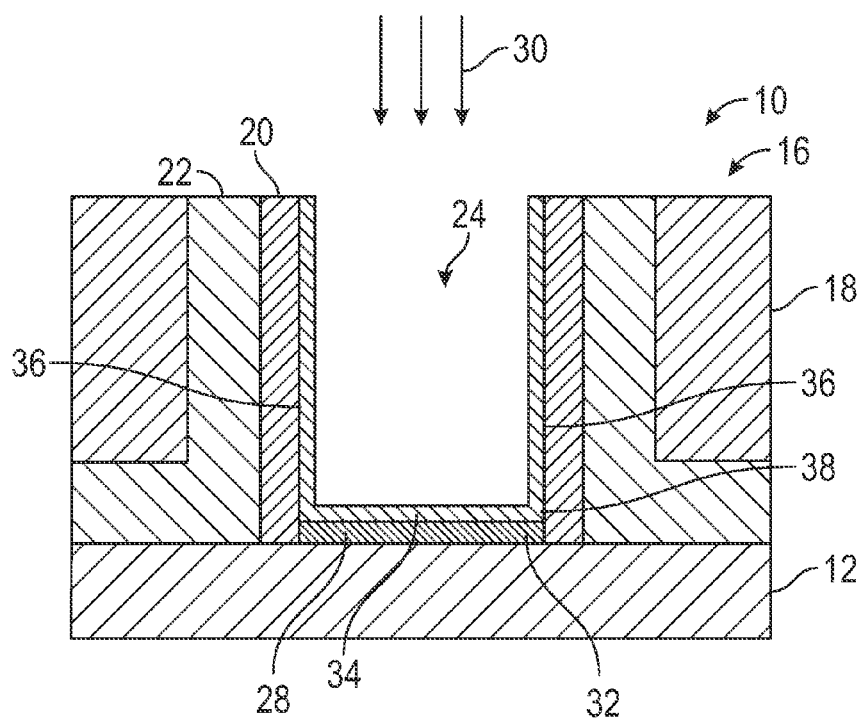

FIG. 2 illustrates, in cross sectional view, the portion of the IC 10 at further advanced fabrication stage in accordance with an exemplary embodiment. Whether or not the interlayer 28 has been previously exposed to the $NF_3$ plasma treatment process 30, the process continues by depositing a high dielectric constant (high-k) dielectric layer 34 overlying the interlayer 28 and sidewalls 36 of the spacer 20 by an ALD process, a CVD process, or the like. In an exemplary embodiment, the high-K dielectric layer 34 has a thickness of from about 0.1 to about 3 nm and the high-k dielectric material includes hafnium oxide, hafnium silicate, zirconium oxide, or hafnium aluminum oxide. In an exemplary embodiment, the high-K dielectric layer 34 is formed of hafnium dioxide ($HfO_2$).

Next, the high-K dielectric layer 34 is annealed. In an exemplary embodiment, the high-K dielectric layer 34 is annealed at a temperature of from about 750 to about 950° C., such as from about 850 to about 925° C., for example at about 900° C.

The high-K dielectric layer 34 may include some partially or imperfectly bonded atoms (e.g., dangling bonds), such as unsaturated bonds between, for example, Hf and O atoms in the $HfO_2$ matrix. In an exemplary embodiment, the high-K dielectric layer 34 may be exposed directly to the $NF_3$ plasma treatment process 30 at this fabrication stage as illustrated in FIG. 2 either before or after annealing. In an exemplary embodiment, the high-K dielectric layer 34 is exposed directly to the $NF_3$ plasma treatment process 30 after being annealed. As discussed above, the plasma treatment process 30 produces fluorine ions that penetrate the high-K dielectric layer 34, displacing and replacing at least some of the partially or imperfectly bonded atoms (e.g., O atoms), thereby incorporating fluorine atoms into the high-K dielectric material to passivate (e.g., reduce the number of dangling bonds) the high-K dielectric layer 34 and form a passivated high-K dielectric layer 38. In an exemplary embodiment, the passivated high-K dielectric layer 38 has a reduced number of interface and bulk defects relative to the untreated high-K dielectric layer 34.

In an exemplary embodiment, the IC 10 is initially exposed to the $NF_3$ plasma treatment process 30 either before or after annealing the high-K dielectric layer 34. In this example, the high-K dielectric layer 34 is exposed to the $NF_3$ plasma treatment process 30 at conditions effective to incorporate fluorine into both the high-K dielectric layer 34 and the underlying interlayer 28 to form the passivated high-K dielectric layer 38 and the passivated interlayer 32. In an exemplary embodiment, fluorine is present in the passivated high-K dielectric layer 38 and/or the passivated interlayer 32 at an atomic % of from about 10 to about 20, such as from about 10 to about 15.

In an exemplary embodiment, the IC 10 is exposed to the $NF_3$ plasma treatment process 30 at conditions that include a temperature of from about 20 to about 500° C., such as from about 20 to about 50° C., for example from about 20 to about 30° C., a pressure of from about 50 millitorr to about 1 torr, and a duration time of from about 5 to about 180 seconds. In an exemplary embodiment, the $NF_3$ plasma treatment process 30 uses $NF_3$ gas diluted an inert gas, such as argon (Ar), at a $NF_3$ to inert gas volumetric gas mix ratio of from about 1:1000 to about 1:1.

Figure 3:
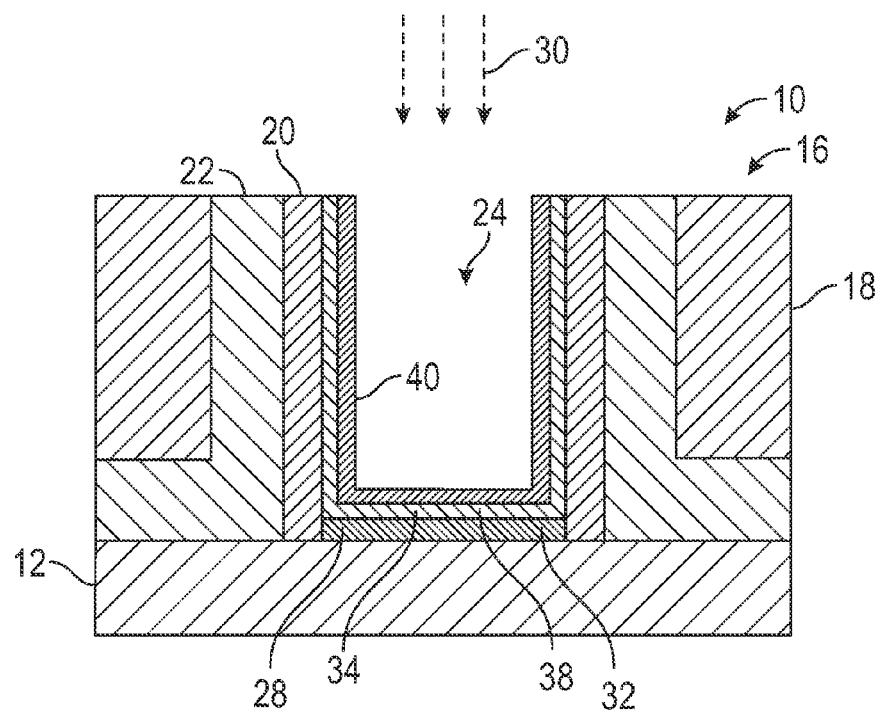

FIG. 3 illustrates, in cross sectional view, the portion of the IC 10 at further advanced fabrication stage in accordance with an exemplary embodiment. Whether or not the interlayer 28 and/or the high-K dielectric layer 34 have been previously exposed to the $NF_3$ plasma treatment process 30, the process continues by depositing a capping layer 40 of titanium nitride (TiN) overlying the high-K dielectric layer 34 by an ALD process or the like. As illustrated, the capping layer 40 may optionally be exposed to the $NF_3$ plasma treatment process 30. In an exemplary embodiment, the IC 10 is initially exposed to the $NF_3$ plasma treatment process 30 by directly exposing the capping layer 40 to the $NF_3$ plasma treatment process 30. In this example, fluorine ions generated from the $NF_3$ plasma treatment process 30 penetrate and passed through the capping layer 40 and become incorporated into the underlying high-K dielectric layer 34 and the interlayer 28 to form the passivated high-K dielectric layer 38 and the passivated interlayer 32 as discussed above.

Figure 4:
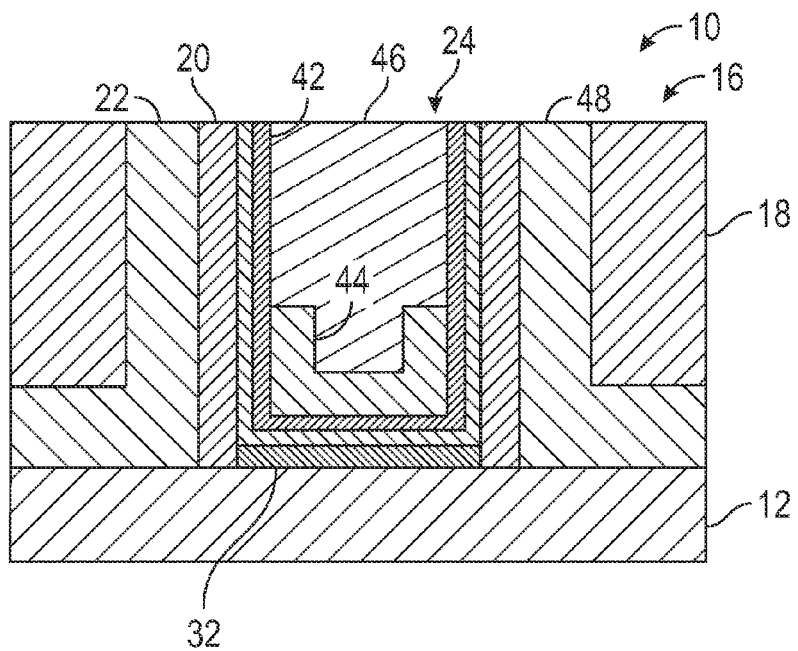

The process continues as illustrated in FIG. 4 by replacing the capping layer 40 (shown in FIG. 3) with a capping layer 42 of TiN or the like using conventional etching (e.g., dry etching process) and deposition processes. A metal gate 44 is formed overlying the capping layer 42 using one or more deposition processes, such as a physical vapor deposition (PVD) process, CVD process, an ALD process, or the like. Depending upon the desired function of the device, the metal gate 44 may include one or more work function layers, such as a P-type work function metal layer and/or a N-type work function metal layer as are known in the art. A low resistance layer 46 of, for example, aluminum (Al) or tungsten (W), is deposited in a remaining portion of the trench 24 using, for example, a CVD process or the like. Next, an upper surface 48 of the FET region 16 is planarized by a chemical mechanical planarization (CMP) process.

Accordingly, integrated circuits and methods for fabricating integrated circuits using fluorine to passivate an interlayer of dielectric oxide material and/or a high-K dielectric layer of a FET region have been described.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
    forming an interlayer of dielectric oxide material in a FET region and overlying a semiconductor substrate;
    depositing a high-K dielectric layer overlying the interlayer; and
    incorporating fluorine (F) into the interlayer and/or the high-K dielectric layer to an atomic % of from about 10 to about 20.

2. The method of claim 1, wherein incorporating F comprises incorporating F into the interlayer prior to depositing the high-K dielectric layer.

3. The method of claim 1, further comprising annealing the high-K dielectric layer, and wherein incorporating F comprises incorporating F into the high-K dielectric layer prior to annealing the high-K dielectric layer.

4. The method of claim 1, further comprising annealing the high-K dielectric layer, and wherein incorporating F comprises incorporating F into the high-K dielectric layer subsequent to annealing the high-K dielectric layer.

5. The method of claim 1, further comprising depositing a capping layer overlying the high-K dielectric layer.

6. The method of claim 5, wherein incorporating F comprises exposing the capping layer to F ions to incorporate F into the interlayer and/or the high-K dielectric layer.

7. The method of claim 1, wherein incorporating F comprises incorporating F into the interlayer and/or the high-K dielectric layer using a $NF_3$ plasma treatment process.

8. The method of claim 7, wherein incorporating F comprises treating the interlayer and/or the high-K dielectric layer with the $NF_3$ plasma treatment process at conditions that include a temperature of from about 20 to about 500° C.

9. The method of claim 7, wherein incorporating F comprises treating the interlayer and/or the high-K dielectric layer with the $NF_3$ plasma treatment process at conditions that include a pressure of from about 50 millitorr to about 1 torr.

10. The method of claim 7, wherein incorporating F comprises treating the interlayer and/or the high-K dielectric layer with the $NF_3$ plasma treatment process at conditions that include a time of from about 5 to about 180 seconds.

11. The method of claim 7, wherein incorporating F comprises treating the interlayer and/or the high-K dielectric layer with the $NF_3$ plasma treatment process using $NF_3$ diluted an inert gas.

12. The method of claim 11, wherein incorporating F comprises treating with the $NF_3$ plasma treatment process using a $NF_3$ to inert gas volumetric gas mix ratio of from about 1:1000 to about 1:1.

13. The method of claim 1, wherein forming the interlayer comprises forming the interlayer that comprises $SiO_2$.

14. The method of claim 1, wherein depositing the high-K dielectric layer comprises depositing the high-K dielectric layer that comprises $HfO_2$.

15. A method for fabricating an integrated circuit comprising:
    forming a trench in an ILD layer of dielectric material in a FET region and overlying a semiconductor substrate;
    forming an interlayer of dielectric oxide material in the trench;
    depositing a high-K dielectric layer overlying the interlayer;
    annealing the high-K dielectric layer to form an annealed high-K dielectric layer; and
    exposing the annealed high-K dielectric layer to a $NF_3$ plasma treatment process to incorporate fluorine (F) into the interlayer and/or the high-K dielectric layer to an atomic % of from about 10 to about 20.

16. The method of claim 15, wherein exposing comprises exposing the annealed high-K dielectric layer to the $NF_3$ plasma treatment process at conditions effective to incorporate fluorine (F) into and passivate both the interlayer and the high-K dielectric layer.

17. The method of claim 15, wherein exposing comprises exposing the annealed high-K dielectric layer to the $NF_3$ plasma treatment process to form a passivated high-K dielectric layer, and wherein the method further comprises forming a metal gate overlying the passivated high-K dielectric layer.

18. The method of claim 17, further comprising forming a low resistance layer overlying the metal gate.

* * * * *